(12) United States Patent
Scholz (10) Patent No.: US 10,651,338 B2
(45) Date of Patent: May 12, 2020

(54) METHOD FOR PRODUCING AN OPTOELECTRONIC SEMICONDUCTOR COMPONENT AND OPTOELECTRONIC SEMICONDUCTOR COMPONENT

(71) Applicant: OSRAM OLED GMBH, Regensburg (DE)

(72) Inventor: Dominik Scholz, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/759,972

(22) PCT Filed: Oct. 4, 2016

(86) PCT No.: PCT/EP2016/073642
§ 371 (c)(1),
(2) Date: Mar. 14, 2018

(87) PCT Pub. No.: WO2017/060223
PCT Pub. Date: Apr. 13, 2017

(65) Prior Publication Data
US 2018/0254378 A1 Sep. 6, 2018

(30) Foreign Application Priority Data

Oct. 6, 2015 (DE) .......................... 10 2015 116 983

(51) Int. Cl.
*H01L 33/00* (2010.01)
*H01L 31/0203* (2014.01)
(Continued)

(52) U.S. Cl.
CPC ...... *H01L 33/0079* (2013.01); *H01L 31/0203* (2013.01); *H01L 31/03044* (2013.01);
(Continued)

(58) Field of Classification Search
CPC .............. H01L 33/0079; H01L 33/007; H01L 33/0095; H01L 33/32; H01L 33/54;
(Continued)

(56) References Cited

U.S. PATENT DOCUMENTS 8,507,302 B1 8/2013 Chu et al.
2010/0009515 A1 1/2010 Wen et al.
(Continued)

FOREIGN PATENT DOCUMENTS

DE 102011015725 A1 10/2012
EP 1962325 A1 8/2008
(Continued)

*Primary Examiner* — Patricia D Reddington
(74) *Attorney, Agent, or Firm* — Slater Matsil, LLP (57) ABSTRACT

A method for fabricating an optoelectronic semiconductor component is disclosed. A semiconductor chip is produced by singularizing a wafer. The semiconductor chip comprises a substrate and a semiconductor layer sequence with an active layer applied to a main side of the substrate. The semiconductor layer sequence has an active region for emission or absorption of radiation and a sacrificial region arranged next to the active region. The sacrificial region in the finished semiconductor component is not intended to emit or absorb radiation. A trench, introduced into the semiconductor layer sequence, penetrates the active layer and separates the active region from the sacrificial region. The semiconductor chip with the semiconductor layer sequence is applied on a carrier. The substrate is detached from the active region of the semiconductor layer sequence. In the sacrificial region, the semiconductor layer sequence remains mechanically connected to the substrate.

18 Claims, 8 Drawing Sheets

(51) Int. Cl.
  *H01L 31/0304*   (2006.01)
  *H01L 31/18*    (2006.01)
  *H01L 33/32*    (2010.01)
  *H01L 33/54*    (2010.01)
  *H01L 21/683*    (2006.01)
  *H01L 31/0352*   (2006.01)
  *H01L 33/06*    (2010.01)
  *H01L 33/62*    (2010.01)

(52) U.S. Cl.
  CPC ........ *H01L 31/186* (2013.01); *H01L 31/1852* (2013.01); *H01L 31/1856* (2013.01); *H01L 31/1892* (2013.01); *H01L 33/007* (2013.01); *H01L 33/0095* (2013.01); *H01L 33/32* (2013.01); *H01L 33/54* (2013.01); *H01L 21/6835* (2013.01); *H01L 31/035209* (2013.01); *H01L 33/06* (2013.01); *H01L 33/62* (2013.01); *H01L 2221/68327* (2013.01); *H01L 2924/00* (2013.01); *H01L 2924/00014* (2013.01); *H01L 2924/12042* (2013.01); *H01L 2933/005* (2013.01); *H01L 2933/0066* (2013.01)

(58) Field of Classification Search
  CPC ........... H01L 31/0203; H01L 31/03044; H01L 31/1852; H01L 31/1856; H01L 31/186; H01L 31/1892
  See application file for complete search history.

(56)  References Cited

U.S. PATENT DOCUMENTS

| | | | |
|---|---|---|---|
| 2010/0171215 A1* | 7/2010 | Fischer | H01L 21/561 |
| | | | 257/734 |
| 2010/0248404 A1 | 9/2010 | Umemura et al. | |
| 2011/0245350 A1 | 9/2011 | Song et al. | |
| 2012/0244683 A1* | 9/2012 | Akagi | H01L 21/187 |
| | | | 438/464 |
| 2013/0069086 A1* | 3/2013 | Gunther | B28D 5/0011 |
| | | | 257/88 |
| 2013/0244356 A1* | 9/2013 | Kim | H01L 33/005 |
| | | | 438/27 |
| 2014/0080287 A1* | 3/2014 | Zull | H01L 31/18 |
| | | | 438/463 |
| 2016/0148971 A1 | 5/2016 | Broekaart et al. | |

FOREIGN PATENT DOCUMENTS

| | | |
|---|---|---|
| EP | 2365538 A2 | 9/2011 |
| FR | 3007576 A1 | 12/2014 |
| WO | 2015077779 A1 | 5/2015 |

\* cited by examiner

METHOD FOR PRODUCING AN OPTOELECTRONIC SEMICONDUCTOR COMPONENT AND OPTOELECTRONIC SEMICONDUCTOR COMPONENT

CROSS-REFERENCE TO RELATED APPLICATIONS

This application is a national phase application under 35 USC 371 that claims the benefit of PCT/EP2016/073642, filed Oct. 4, 2016, which claims the priority of German patent application 10 2015 116 983.5, filed Oct. 6, 2015, each of which is incorporated herein by reference.

TECHNICAL FIELD

A method for producing an optoelectronic semiconductor component is provided. In addition, an optoelectronic semiconductor component is provided.

BACKGROUND

Optoelectronic semiconductor components are known in the art.

SUMMARY

Embodiments of the invention disclose a method for producing an optoelectronic semiconductor component. A semiconductor chip is produced by singularizing a wafer. The semiconductor chip comprises a substrate and a semiconductor layer sequence with an active layer applied to a main side of the substrate. The semiconductor layer sequence has an active region for emission or absorption of radiation and a sacrificial region arranged next to the active region in a direction parallel to the main side. The sacrificial region in the finished semiconductor component is not intended to emit or absorb radiation. A trench, introduced into the semiconductor layer sequence, penetrates the active layer and separates the active region from the sacrificial region.

The semiconductor chip with the semiconductor layer sequence is applied on a carrier. The substrate is detached from the active region of the semiconductor layer sequence. In the sacrificial region, the semiconductor layer sequence remains mechanically connected to the substrate. Subsequently, the substrate is removed from the semiconductor layer sequence by detaching the substrate in the sacrificial region.

In another embodiment, an optoelectronic semiconductor component comprises a carrier and a semiconductor layer sequence arranged on the carrier with an active layer running parallel to a main side of the carrier. A trench in the semiconductor layer sequence extends completely through the semiconductor layer sequence. The trench separates an active region of the semiconductor layer sequence from a sacrificial region of the semiconductor layer sequence arranged next to the active region in a lateral direction, parallel to the main side of the carrier. The sacrificial region forms an edge region of the semiconductor layer sequence. Radiation is emitted or absorbed by the active layer in the active region during normal operation. In the sacrificial region, the active layer and/or the semiconductor layer sequence are damaged. The sacrificial region is not intended to emit or absorb radiation. The semiconductor layer sequence is free of its growth substrate. No mechanically self-supporting substrate or another carrier is arranged downstream of the semiconductor layer sequence in a direction away from the carrier.

BRIEF DESCRIPTION OF THE DRAWINGS

Hereinafter, a method described herein for producing an optoelectronic semiconductor component and an optoelectronic semiconductor component will be explained in more detail with reference to drawings by means of exemplary embodiments. Here, like reference numerals indicate like elements in the figures. However, the size ratios involved are not to scale, individual elements may rather be illustrated with an exaggerated size for a better understanding.

As shown in:

FIGS. 2A to 2E and 3 different positions in exemplary embodiments of a production method described here in plan view and in side view;

The following reference numerals can be used in conjunction with the drawings:

1 semiconductor chip
2 carrier
3 encapsulation layer
4 solder/adhesive
10 substrate
11 semiconductor layer sequence
12 active layer
13 active region
14 sacrificial region
15 trench
100 optoelectronic semiconductor component
110 main side of the substrate 10

DETAILED DESCRIPTION OF ILLUSTRATIVE EMBODIMENTS

Embodiments of the invention will be described in text, followed by a discussion based on the figures.

Embodiments of the invention provide a method for producing an optoelectronic semiconductor component with a reduced production error rate. Further embodiments provide an optoelectronic semiconductor component produced by such a method.

According to at least one embodiment, a method for producing an optoelectronic semiconductor component is disclosed. A semiconductor chip, produced by singularizing a wafer, is provided. The semiconductor chip is thus already separated from other semiconductor chips that were produced simultaneously with it. Also, the semiconductor chip itself is not intended to be further separated into two or more smaller semiconductor chips. The wafer is, for example, a growth substrate for a plurality of semiconductor chips. For example, the semiconductor chip still comprises parts of the wafer with traces of a singulation process. For example, the wafer comprises or consists of Si, SiC, GaN, Ge, sapphire, metal, plastic or glass.

According to least one embodiment, the semiconductor chip comprises a substrate and one or more, in particular exactly one, semiconductor layer sequence applied, preferably directly applied, to a main side of the substrate. The semiconductor layer sequence comprises an active layer. The active layer preferably runs parallel or substantially parallel to the main side of the substrate.

The substrate may, for example, be the growth substrate for the semiconductor layer sequence. For example, the substrate is part of the singularized wafer. The substrate may comprise or consist of the same materials as the materials referred to in connection with the wafer. The substrate may comprise traces of a singulation process, such as sawing grooves, on side surfaces, transverse to the main side. Furthermore, the lateral extensions of the substrate, parallel to the main side of the substrate, are preferably adapted essentially to the lateral extensions of the semiconductor layer sequence. By way of example, the lateral dimensions of the substrate amount to at least 80% or at least 100% and/or at most 200% or at most 120% of the lateral extensions of the semiconductor layer sequence.

The semiconductor layer sequence is based for example on a III-V compound semiconductor material. The semiconductor material is, for example, a nitride compound semiconductor material such as $Al_nIn_{1-n-m}Ga_mN$, or a phosphide compound semiconductor material such as $Al_nIn_{1-n-m}Ga_mP$, or also an arsenide compound semiconductor material such as $Al_nIn_{1-n-m}Ga_mAs$, where $0 \leq n \leq 1$, $0 \leq m \leq 1$ and $m+n \leq 1$, respectively. The semiconductor layer sequence can have dopants and additional constituents. For the sake of simplicity, however, only the essential constituents of the crystal lattice of the semiconductor layer sequence, that is to say Al, As, Ga, In, N or P, are indicated, even if these can be partially replaced and/or supplemented by small amounts of further substances. The semiconductor layer sequence is preferably based on AlInGaN.

The active layer has, for example, at least one pn-junction and/or one quantum well structure in the form of a single quantum well, in short SQW, or in the form of a multi-quantum well structure, MQW for short.

In accordance with at least one embodiment, the semiconductor layer sequence comprises one, in particular exactly one, active region for the emission or absorption of radiation. In the lateral direction next to it, i.e., in the direction parallel to the main side next to it, a sacrificial region is arranged.

The active region is preferably intended along the entire lateral extent for the emission or absorption of radiation, and forms there a luminous area or detection area. For example, the active layer is formed contiguous within the active region. The active region can also form a pixelated or segmented luminous area.

In accordance with at least one embodiment, unlike the active region, the sacrificial region is not intended or set up for the emission or absorption of radiation.

In particular, the sacrificial region does not contribute to the luminous area or detection area. The sacrificial region preferably does not fulfill any optoelectronic function in the finished component. For example, the sacrificial region in the finished component is not electrically contacted.

In the active region and in the sacrificial region, the semiconductor layer sequences are preferably identical in terms of the layer structure. In particular, the heights or thicknesses of the semiconductor layer sequence are the same in the active region and in the sacrificial region.

According to least one embodiment, a trench is introduced into the semiconductor layer sequence, which penetrates the active layer and separates the active region from the sacrificial region. For example, the trench is introduced into the semiconductor layer sequence from a side facing away from the substrate. In this case, the active layer in the sacrificial region and the active layer in the active region are preferably not contiguous. In a plan view of the semiconductor layer sequence, the sacrificial region is arranged, for example, in an edge region or corner region of the semiconductor layer sequence and is completely separated from the active region by the trench.

The lateral extent of the sacrificial region in one or more directions is preferably substantially smaller than the lateral extent of the active region in this direction or directions. For example, in plan view of the semiconductor layer sequence, an area of the sacrificial region is at most one tenth or ⅕₀ or ¹⁄₁₀₀ of the area of the active region.

By way of example, the lateral extent of the semiconductor layer sequence in one direction is at least 100 µm or 500 µm or 1 mm. The lateral extent of the sacrificial region in this direction is, for example, at least 10 µm or at least 30 µm or at least 50 µm. Alternatively or additionally, the lateral extent of the sacrificial region in this direction is at most 200 µm or at most 100 µm or at most 60 µm.

The width of the trench, measured parallel to the main side of the substrate, is for example at least 10 µm or 30 µm or 50 µm. Alternatively or additionally, the width of the trench is at most 200 µm or 100 µm or 60 µm.

In accordance with at least one embodiment, the semiconductor chip is applied on a carrier with the semiconductor layer sequence ahead. The carrier is preferably a mechanically self-supporting carrier which is suitable for mechanically supporting and stabilizing the semiconductor chips. The carrier may be, for example, a printed circuit board or a foil or a wafer, for example a silicon wafer or a germanium wafer. In particular, the carrier can comprise or consist of plastic, metal, ceramic, glass or a semiconductor material. The carrier can be permanently connected to the semiconductor chip by the application of the semiconductor chip or be detached again later.

According to at least one embodiment, the substrate is detached from the active region of the semiconductor layer sequence. In this case, the sacrificial region of the semiconductor layer sequence initially remains mechanically connected to the substrate or at least partially connected. In other words, the substrate is first detached in the entire active region, but not in the entire sacrificial region. Although in a sub-region of the sacrificial region a detachment can take place already before the detachment in the active region, a mechanical connection between substrate and the semiconductor layer sequence in the sacrificial region remains at least until the semiconductor layer sequence is completely detached from the substrate in the active region.

During the detachment, for example, a space or a gap is formed between the substrate and the semiconductor layer sequence. This space or gap may be filled, for example, with air or another gas or with solid or liquid substances that form during the detachment process. By way of example, when a sapphire substrate is detached from a GaN-based semiconductor layer sequence by means of a laser, liquid Ga droplets are formed in the gap that result from decomposition of the topmost GaN layers by the laser. The nitrogen escapes in the form of gas.

According to at least one embodiment, the method comprises a subsequent step, in which the substrate is finally removed from the semiconductor layer sequence. This is achieved by detachment, in particular complete detachment, of the substrate in the sacrificial region. For example, the space or gap between the semiconductor layer sequence and the substrate is also continued on the sacrificial region. Subsequently, the substrate can be completely removed from the semiconductor layer sequence so that there is no longer any connection between the semiconductor layer sequence and the substrate. The semiconductor layer sequence is then mechanically stabilized, for example, only by the carrier.

In at least one embodiment, the method for producing an optoelectronic semiconductor component comprises a step A) in which a semiconductor chip produced by singularizing a wafer is provided, wherein the semiconductor chip comprises a substrate and a semiconductor layer sequence with an active layer deposited on a main side of the substrate. The semiconductor layer sequence has an active region for the emission or absorption of radiation and a sacrificial region arranged in the direction parallel to the main side next to the active region. In the finished semiconductor component the sacrificial region is not provided for the emission or absorption of radiation. A trench introduced into the semiconductor layer sequence penetrates the active layer and separates the active region from the sacrificial region. In a step B), the semiconductor chip is applied to a carrier with the semiconductor layer sequence ahead. In a step C), the substrate is detached from the active region of the semiconductor layer sequence, wherein in the sacrificial region the semiconductor layer sequence remains mechanically connected to the substrate. Subsequently, in a step D), the substrate is finally removed from the semiconductor layer sequence by detachment of the substrate in the sacrificial region.

The invention described here is based, inter alia, on the recognition that when a substrate is removed from an individual component, such as a semiconductor chip, there is always a location on the individual component at which the substrate is finally detached. By, for example, the explosive separation and by tension in the single component the semiconductor layer sequence located at this point is particularly at risk to be damaged by cracks.

The invention now makes use of the idea of forming a small sacrificial region in the semiconductor layer sequence, in which the substrate remains connected to the semiconductor layer sequence last. In the final separation of the substrate there will be damage at most in the sacrificial region. A spread of these damages into the active region is prevented by the trench. Overall, a method is thus specified in which individual components can be removed from a substrate in a particularly efficient and gentle manner.

By the use of the sacrificial region, the individual semiconductor chips can be produced more space-saving in total and thus with higher integration density. Usually, the semiconductor layer sequences of a plurality of semiconductor chips are grown on a common wafer or growth substrate. When singulating the semiconductor chips, a sufficient distance of, for example, at least 30 µm must be present between two adjacent semiconductor layer sequences. In this way, it is guaranteed that cracks that occur when the wafer or growth substrate is removed do not continue into the semiconductor layers.

By using the sacrificial region, it is possible to reduce the distance between two adjacent semiconductor layer sequences necessary for the singulation to values of less than or equal to 20 µm. Thus, the integration density is increased.

According to at least one embodiment, steps A) to D) are carried out in the stated sequence as separate method steps. The steps C) and D) can also smoothly merge into one another, that is to say the detachment process can be continued continuously from the active region into the sacrificial region.

The trench may be formed prior to singulation of the wafer into the semiconductor chips. However, the trench may also be formed only after step A) or after step B), but preferably before step C).

According to at least one embodiment, the method produces a plurality of optoelectronic semiconductor components. In this case, in step B) a plurality of semiconductor chips produced by singularizing a wafer are applied together laterally next to one another on the carrier. The plurality of semiconductor chips may be implemented like the semiconductor chip described so far and below. Prior to step C), i.e. before the substrate is removed, each semiconductor chip has its own, one-to-one associated substrate. In particular, the substrates of the individual semiconductor chips are no longer connected to each other, but separated from each other and spaced from each other.

According to at least one embodiment, the substrate remains intact when detaching in steps C) and D). In particular, the substrate is not destroyed or severely damaged. Only minor cracks at the interface between the semiconductor layer sequence and the substrate can occur. After an optional polishing step the substrate can be reused, for example, and can serve again as a growth substrate, for example. In particular, in the detachment process of steps C) and D), the substrate is not or not significantly reduced in its lateral and/or vertical extent. The substrate is preferably self-supporting and mechanically stable after removing.

In order to achieve this, for example, a sacrificial layer also based on a semiconductor material may be used between the semiconductor layer sequence and the substrate. For example, in the detachment process, only the sacrificial layer is destroyed, not the substrate.

According to at least one embodiment, before the steps C) and D), the trench completely penetrates the semiconductor layer sequence in the vertical direction, perpendicular to the lateral direction. The trench preferably extends as far as the substrate. In particular, a bottom surface of the trench is formed in or on the substrate. Thus, no remainder of the semiconductor layer sequence is present between the bottom surface of the trench and the substrate.

Because the trench is guided all the way to the substrate, the sacrificial region is separated from the active region particularly safely so that any damage in the sacrificial region can hardly continue to the semiconductor layer sequence in the active region.

According to at least one embodiment, in steps C) and D), the substrate is detached from the semiconductor layer sequence by a laser separation method, in other words laser lift-off, or LLO for short. In this case, the laser is preferably irradiated from a side facing away from the carrier to the substrate.

Preferably, the diameter of the laser is smaller than the width or smallest lateral extent of the sacrificial region. For example, the width of the sacrificial region is at least twice or five times or ten times the diameter of the laser. Thus, the probability can be further increased that the damage of the semiconductor layer sequence is limited to the sacrificial region.

However, the diameter of the laser beam can also be chosen to be greater than the width of the sacrificial region, for example between 100 µm and 4 mm. The detachment is then achieved, for example, not by a single laser pulse, but by a scan with only a small offset between adjacent tracks, so that overlap areas arise at which the laser beam strikes the semiconductor layer sequence twice or more often. The size of this overlap area then defines the size of the separation area in which it is actually detached. The separation area can thus be set to a diameter significantly smaller than 1 mm. Especially for larger laser beam diameters, the intensities are not homogeneous, but for example Gaussian distributed over the diameter, so that the diameter of the separation region can be adjusted in the region of the width of the sacrificial region or the trench. In particular, in a continuous scan of the component with the laser it can be achieved that the detachment takes place last in the sacrificial region.

According to at least one embodiment, the sacrificial region, in a plan view of the semiconductor layer sequence, forms a continuous path which extends completely around the active region of the semiconductor layer sequence. Preferably, the trench also forms a continuous path which extends completely around the active region all around. In other words, in plan view, the sacrificial region and/or the trench form a frame around the active region of the semiconductor layer sequence. For example, the width of the frame in the case of the sacrificial region is within the above limits for the lateral extent of the sacrificial region.

According to at least one embodiment, the semiconductor layer sequence has a plurality of sacrificial regions. In this case, the sacrificial regions are preferably likewise separated from one another by trenches as described above. Furthermore, each sacrificial region is preferably separated from the active region by a trench as described above. In a plan view of the semiconductor layer sequence, the sacrificial regions are arranged, for example, around the active region. For example, the sacrificial regions then also form a frame around the active region, the frame being interspersed with trenches and thus having interruptions. So the frame is not contiguous.

In the embodiment with multiple sacrificial regions, the semiconductor layer sequence remains connected to the substrate in only one sacrificial region or in multiple sacrificial regions or in all sacrificial regions until it is finally removed. The user of the method can himself decide in which of the multiple sacrificial regions the substrate remains connected to the semiconductor layer sequence until the final removing.

According to at least one embodiment, after step D), the semiconductor layer sequence in the sacrificial region is removed. For example, on the finished component, the semiconductor layer sequence of the sacrificial region no longer has any function and can therefore be removed.

According to at least one embodiment in step B) the semiconductor chip is mechanically permanently attached to the carrier and, for example, electrically contacted. The carrier in this case is preferably a printed circuit board to which the semiconductor chip is soldered or glued.

According to at least one embodiment, the carrier is detached from the semiconductor chip after step D). Preferably, the carrier is removed even before the semiconductor layer sequence is removed in the sacrificial region. Even when the carrier is detached, cracks can occur in the semiconductor layer sequence. By using the sacrificial region, such cracks are preferably transferred to the sacrificial region. Such cracks then tear off at the trench and do not continue into the active region of the semiconductor layer sequence.

According to at least one embodiment, an encapsulation layer is introduced into the trench before steps C) and D), preferably before the singulation of the semiconductor chips. The encapsulation layer protects the semiconductor layer sequence preferably from external influences. In particular, the encapsulation layer is applied to side surfaces and to a bottom surface of the trench so that inner sides of the trench are preferably completely covered by the encapsulation layer. In this case, the encapsulation layer can comprise or consist of, for example, a silicon oxide, such as $SiO_2$, or a silicon nitride, such as SiN.

Particularly preferably, the encapsulation layer has an absorption layer or consists of such. In the absorption layer, the irradiated laser radiation for the detachment process is absorbed. This absorption can further lead to a decomposition of the encapsulation layer in the region of the trench. This ensures a gentle removing of the substrate from the semiconductor layer sequence, since the encapsulation layer in the region of the trench does not have to be mechanically removed, for example by tearing off. It can also be prevented in this way that laser radiation strikes the carrier in the region of the trench and damages it there.

Even in the encapsulation layer, damage can occur during the detachment process of the substrate and/or the carrier and/or when the semiconductor chips are singulated, which can reduce the aging resistance of the finished semiconductor component. However, by using the trench and the sacrificial region, damage within the encapsulation layer, which may occur when the substrate and/or the carrier is removed and/or when the semiconductor chips are singulated, is likewise limited to the sacrificial region. Due to the trench, these damages then cannot continue on the active region so that the active region remains optimally protected by the encapsulation layer.

In accordance with at least one embodiment, the semiconductor chip is a sapphire chip. The substrate in this case is a sapphire growth substrate. The semiconductor layer sequence is based, for example, on AlInGaN and is grown on the substrate. The carrier is, for example, a microelectronic-containing Si wafer.

In addition, an optoelectronic semiconductor component is specified. The optoelectronic semiconductor component can be produced, for example, by the described method. That means, all features disclosed in connection with the method are also disclosed for the semiconductor component and vice versa.

According to at least one embodiment, the optoelectronic semiconductor component has a carrier, on which a semiconductor layer sequence with an active layer is arranged. The active layer preferably runs substantially parallel to a main side of the carrier.

According to at least one embodiment, the semiconductor component has a trench which is introduced into the semiconductor layer sequence and which extends completely through the semiconductor layer sequence. In this case, the trench preferably separates an active region of the semiconductor layer sequence from a sacrificial region of the semiconductor layer sequence arranged next to the active region in a lateral direction. The lateral direction is preferably a direction parallel to the main side of the carrier.

According to at least one embodiment, the sacrificial region forms an edge region of the semiconductor layer sequence. In particular, the sacrificial region in plan view is therefore not completely surrounded by the active region of the semiconductor layer sequence.

According to at least one embodiment, radiation is emitted or absorbed by the active layer in the active region during normal operation of the optoelectronic semiconductor component. In contrast, in the sacrificial region, the active layer and/or the semiconductor layer sequence may be damaged, so that the sacrificial region is less suitable or not at all suitable for emission or absorption of radiation. In particular, the sacrificial region is not intended or not set up for the emission or absorption of radiation or does not contribute thereto.

According to at least one embodiment, the semiconductor layer sequence is free of its growth substrate. That is, the growth substrate is detached from the finished semiconductor component. In particular, no mechanically self-supporting substrate or another carrier is arranged downstream of the semiconductor layer sequence in a direction away from the carrier. By way of example, the semiconductor layer sequence together with any passivation layer on the semiconductor layer sequence forms a radiation entrance surface or radiation exit surface of the semiconductor component.

In accordance with at least one embodiment, the semiconductor component is produced by the method described above.

Reference will now be made to the figures. In FIGS. 1A to 1E an alternative manufacturing method for semiconductor components is shown first.

Figure 1A:
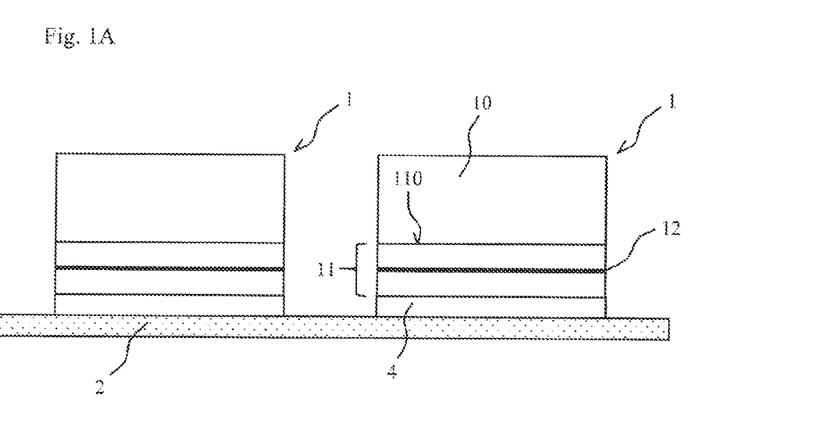
FIGS. 1A to 1E different positions in an alternative production method in side view and plan view.

FIG. 1A shows a first position in which two semiconductor chips 1 are applied to a carrier 2. Each of the semiconductor chips 1 is permanently attached to the carrier 2 by means of a solder material 4 or an adhesive 4. The semiconductor chips 1 comprise a semiconductor layer sequence 11 with an active layer 12. The active layer 12 is provided, for example, during normal operation for the emission or absorption of radiation. The main extension direction of the active layer 12 runs essentially parallel to the main side of the carrier 2.

In the direction away from the carrier 2, each semiconductor layer sequence 11 of each semiconductor chip 1 is followed by a substrate 10. The semiconductor layer sequences 11 are each applied directly to a main side 110 of the corresponding substrate 10. The substrate 10 is, for example, a growth substrate for the semiconductor layer sequence 11, for example a sapphire substrate.

The semiconductor chips 1 are applied to the carrier 2 in a lateral direction, parallel to the main side of the carrier 2, next to each other and at a distance from one another. The distance between the two semiconductor chips 1 on the carrier 2 is for example between 5 µm and 1 cm inclusive.

Figure 1B:
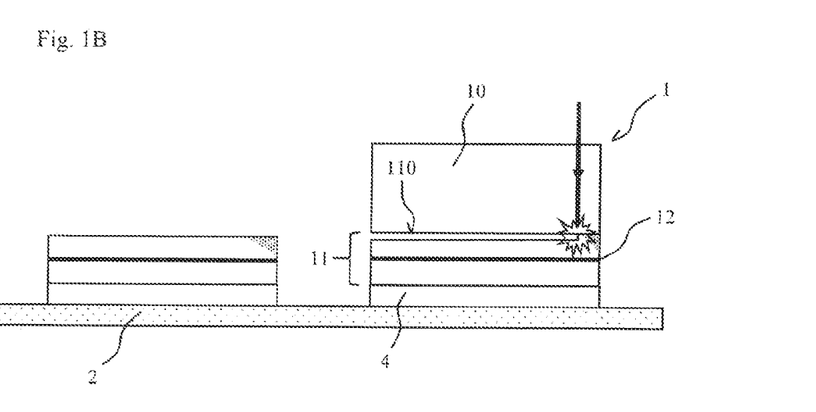

FIG. 1B shows a subsequent position in the method in which the substrates 10 are detached from the semiconductor layer sequences 11. This happens in the present case with a laser, in a so-called laser lift-off method. By means of the laser radiation, for example, a sacrificial layer based on a semiconductor material and located between the semiconductor layer sequence 11 and the substrate 10 is dissolved or destroyed, so that the substrate 10 can be removed from the semiconductor layer sequence 11.

It can be seen in FIG. 1B that the semiconductor layer sequence 11 and the substrate 10 remain connected to one another in an edge region until the final removing of the substrate 10. In this edge region, increased stresses occur within the semiconductor layer sequence, so that the semiconductor layer sequence 11 in the edge region can be damaged during the final removing of the substrate. In the present case, this is represented by the dotted areas in the semiconductor layer sequence 11.

Figure 1C:
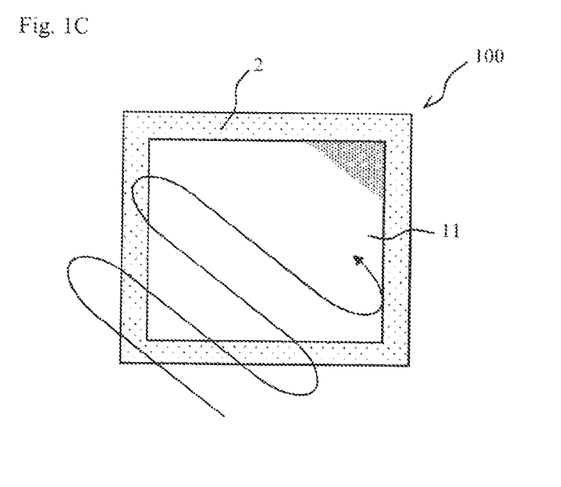
Figure 1D:
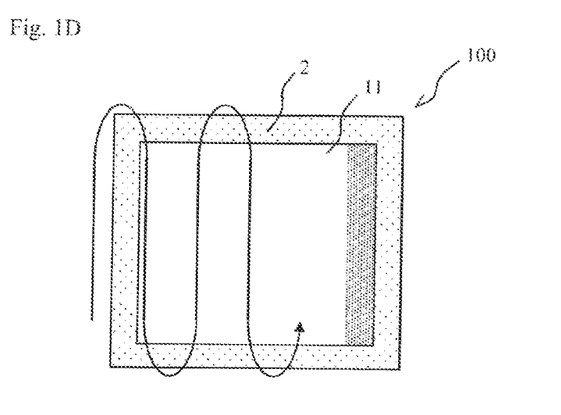
Figure 1E:
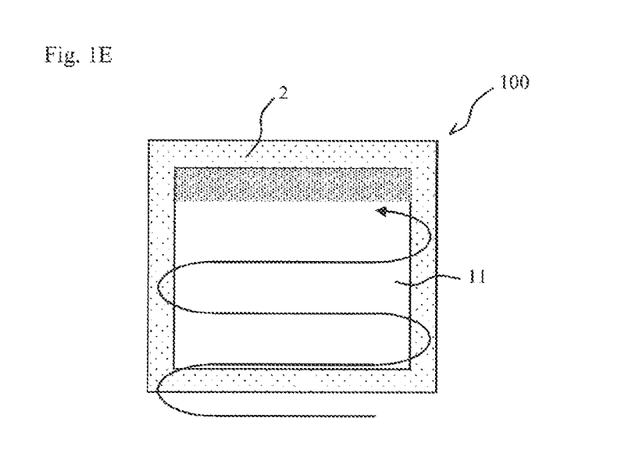

In FIGS. 1C to 1E, semiconductor layers 11 are shown by way of example in plan view after the substrate 10 has been detached. Depending on whether the laser has been guided over the substrate in the diagonal direction or transverse direction or longitudinal direction, the damage occurs in the semiconductor layer sequence 11 in a corner region or a transverse region or a longitudinal region. These regions of the semiconductor layer sequence 11 may be damaged in such a way that they are no longer suitable for emission or absorption of radiation.

FIGS. 2A to 2D show an exemplary embodiment of the production method described here, in which the aforementioned problem is solved.

Figure 2A:
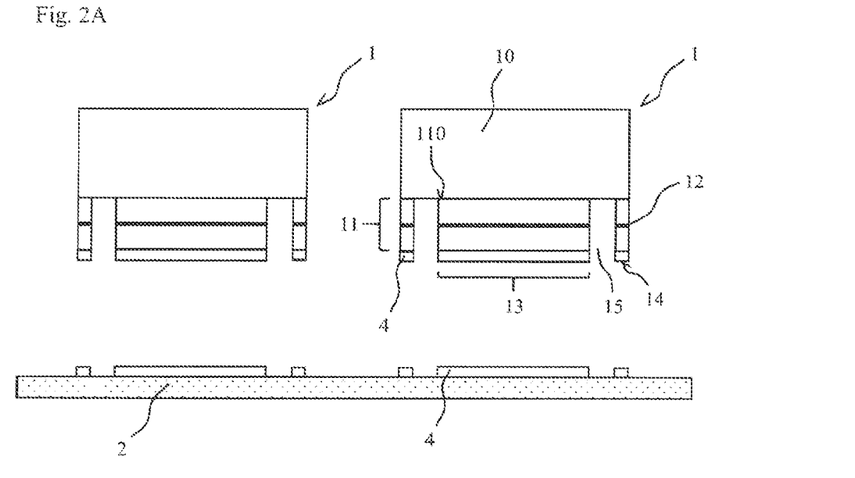

FIG. 2A shows a first position in the method in which two semiconductor chips 1 produced by singularizing a wafer are applied on a carrier 2 with a semiconductor layer sequence 11 ahead. On a side of the semiconductor layer sequence 11 facing away from the carrier 2, each semiconductor chip 1 also has a substrate 10, for example the growth substrate for the semiconductor layer sequence 11. The substrates 10 of the individual semiconductor chips 1 are not interconnected with one another.

The semiconductor layer sequence 11 is based for example on a III-nitride semiconductor material. The substrates 10 are, for example, sapphire substrates. The carrier 2 is for example a microelectronics-containing carrier.

Both on the carrier 2 and on the semiconductor layer sequence 11, solder material 4 or adhesive 4 is provided.

In FIG. 2A, unlike in FIG. 1A, the semiconductor layer sequences 11 of the individual semiconductor chips 1 are separated in a lateral direction into two regions, namely a sacrificial region 14 and an active region 13.

The active region 13 is spaced from the sacrificial region 14 by a trench 15 that extends completely through the semiconductor layer sequence 11 and extends to the substrate 10. The active region 13 of the semiconductor layer sequence 11 is the region which is provided in the later finished semiconductor component 100 for emission or absorption of radiation. The sacrificial regions 14, on the other hand, are not intended to emit or absorb radiation.

Figure 2B:
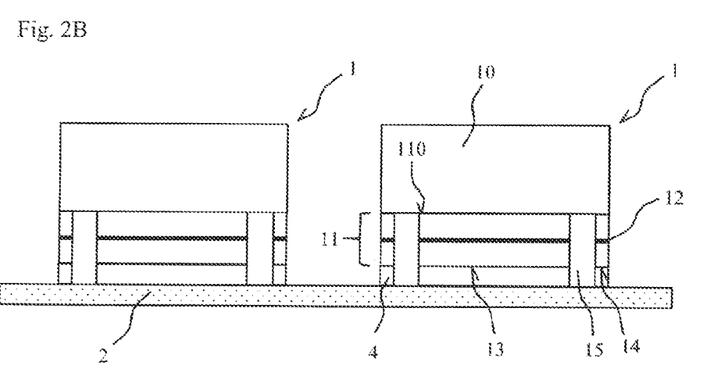

FIG. 2B shows a position in the method in which the semiconductor chips 1 are applied to the carriers 2 and are soldered or glued to the carrier 2. In this way, the semiconductor chips 1 are electrically contacted with the carrier 2 and permanently connected to the carrier 2.

Figure 2C:
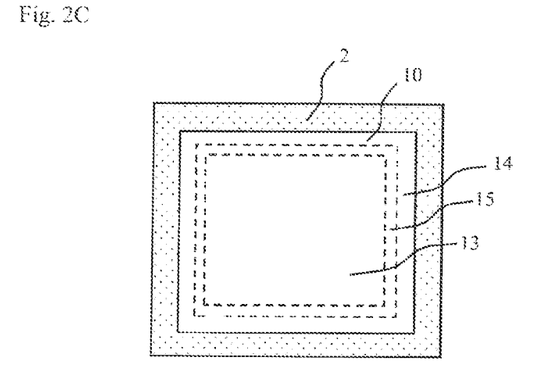

FIG. 2C shows one of the semiconductor chips 1 from the position of FIG. 2B in a plan view of the substrate 10. It can be seen that the sacrificial region 14 forms a contiguous path that extends completely around the active region 13 all around. Likewise, the trench 15 forms a contiguous path which extends completely around the active region 13. In other words, the sacrificial region 14 and the trench 15 each form a contiguous frame around the active region 13.

Figure 2D:
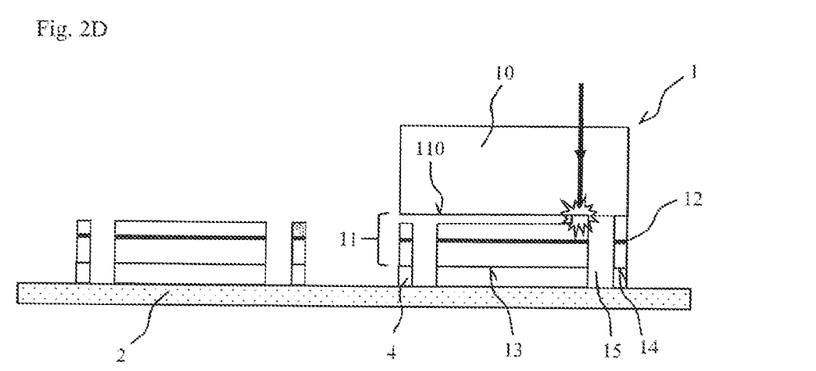

FIG. 2D shows a position in the method in which the substrates 10 are respectively detached from the semiconductor layer sequence 11 of the semiconductor chips 1 by means of a laser. In this case, the laser is irradiated onto the substrate 10 from a side facing away from the carrier 2. The substrate 10 itself is substantially transparent and non-absorbent for the laser. Only in the interface between the semiconductor layer sequence 11 and the substrate 10, for example in the region of a sacrificial layer of the semiconductor layer sequence 11, the laser radiation is absorbed, resulting in a detachment of the substrate 10 from the semiconductor layer sequence 11. For example, the laser scans the interface between the substrate 10 and the semiconductor layer sequence 11 point by point or continuously.

FIG. 2D shows how the laser effects detachment of the substrate 10 from the semiconductor layer sequence 11 in the active region 13. In the sacrificial region 14, the semiconductor layer sequence 11 is still connected to the substrate 10. Subsequently, the substrate 10 is also detached from the semiconductor layer sequence 11 in the sacrificial region 14 and thereby finally removed from the semiconductor layer sequence 11. In this case, the substrate 10 remains essentially intact, that is to say it has no damage after separation except, for example, to minor cracks on the surface. For example, the substrate 10 can be reused for a further growth process.

Figure 2E:
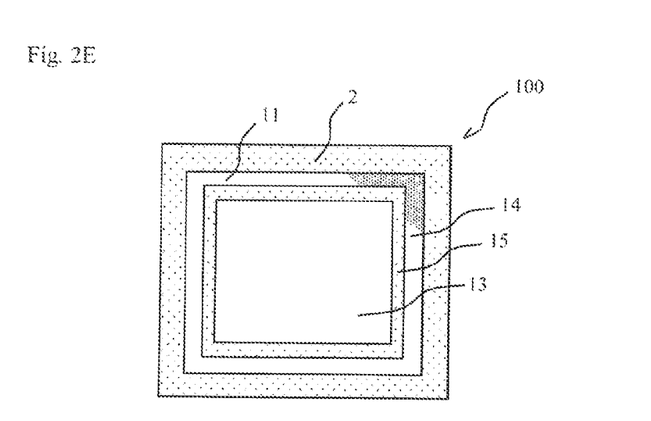
FIGS. 2E to 2L exemplary embodiments of optoelectronic semiconductor components described herein in plan view.

An exemplary embodiment of an optoelectronic semiconductor component 100 after removing of the substrate 10 is shown in FIG. 2E. In this case, the semiconductor component 100 is shown in plan view of the semiconductor layer sequence 11. Again the frame-like sacrificial region 14 and the frame-like trench 15, which run around the active region 13, can be seen. A damage of the semiconductor layer sequence 11 occurs only in the corner region of the sacrificial region 14, in which the substrate 10 has remained connected with the semiconductor layer sequence 11 till the end. The damage in the sacrificial region 14 is not continued to the active region 13, since the trench 15 has prevented the spread of cracks or damage from the sacrificial region 14 into the active region 13. The active region 13 may then optimally contribute along its entire lateral extent to the absorption or emission of radiation.

In FIGS. 2F to 2L, various exemplary embodiments of a semiconductor component 100 are again shown in plan view. In this case, the respective semiconductor components 100 differ in particular with regard to the configuration of the sacrificial region 14.

Figure 2F:
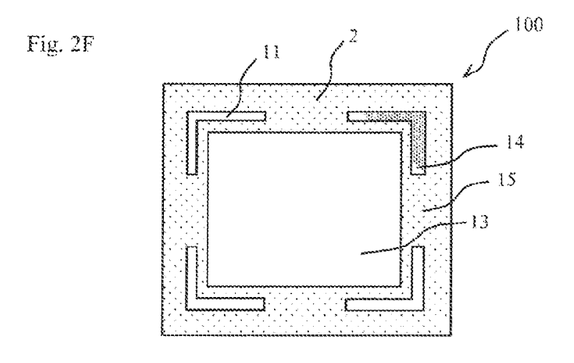

In FIG. 2F, four sacrificial regions 14 are present, each of which has L-shaped cross sections in plan view and each surrounds corner regions of the active region 13. Damage only appears in that sacrificial region 14 in which the substrate 10 was finally detached from the semiconductor layer sequence 11.

Figure 2G:
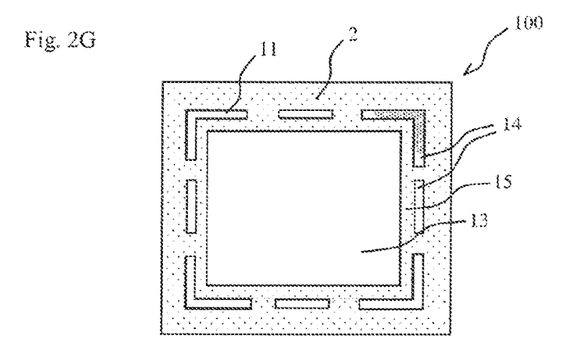

In FIG. 2G, eight sacrificial regions 14 are present, which run around the active region 13 in a plan view. In corner regions of the active region 13 again L-shaped sacrificial regions 14 are arranged, in total the sacrificial regions 14 form a frame around the active region 13, which is interrupted at some points by trenches 15. The interruptions between the sacrificial regions allow escape of gaseous release products, which can reduce the pressure and thus the stress during removing.

Figure 2H:
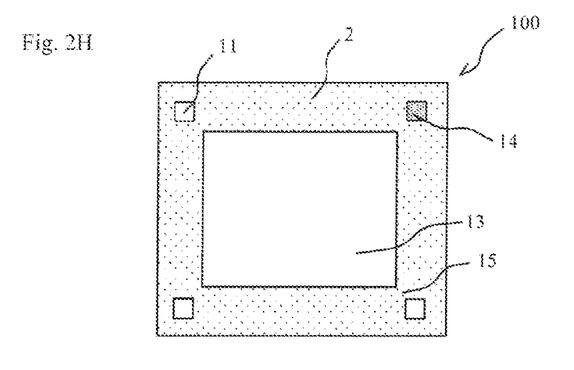

In FIG. 2H, four sacrificial regions 14 are respectively arranged at the corners of the active region 13 and form cuboid-shaped or square-shaped or point-like structures there. Again, only the sacrificial region 14 is damaged in which the substrate has remained connected with the semiconductor layer sequence 11 till the end.

Figure 2I:
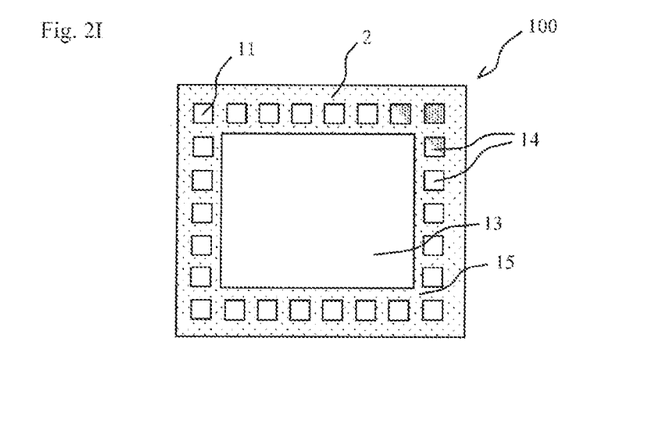

In FIG. 2I, a plurality of sacrificial regions 14 are arranged around the active region 13. The sacrificial regions 14 each have square or rectangular or point-like basic shapes. The sacrificial regions 14 are spaced apart by trenches 15.

Figure 2J:
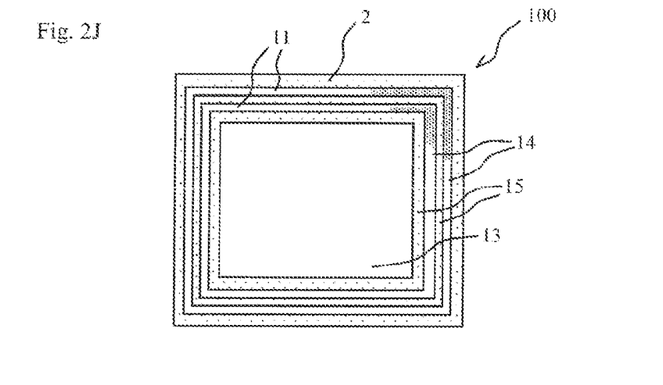

In FIG. 2J, the active region 13 is completely surrounded by two sacrificial regions 14. Each sacrificial region 14 forms a contiguous path around the active region 13. In other words, the active region 13 is surrounded by two frame-shaped sacrificial regions 14. Between the active region 13 and the nearest sacrificial region 14, a frame-like trench 15 is formed. The sacrificial regions 14 are also mutually spaced by a frame-like trench 15 all-around the active region 13. The sacrificial regions 14 each have damages in a corner region, which are not continued to the active region 13.

Such a plurality of successive sacrificial regions increases the mechanical stability and better prevents tilting of the substrate during detachment.

Figure 2K:
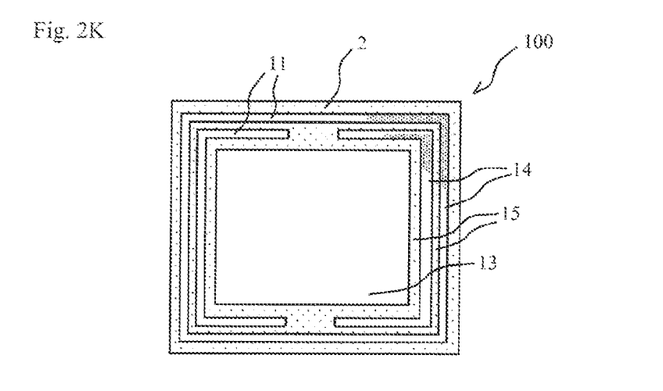

FIG. 2K shows an exemplary embodiment of a semiconductor component 100 which essentially corresponds to the exemplary embodiment of FIG. 2J. Unlike in FIG. 2J, however, the interior of the two frames is interrupted in partial areas by a trench 15. By contrast, the outer sacrificial region 14 runs around the active region 13 in a contiguous and uninterrupted manner.

Figure 2L:
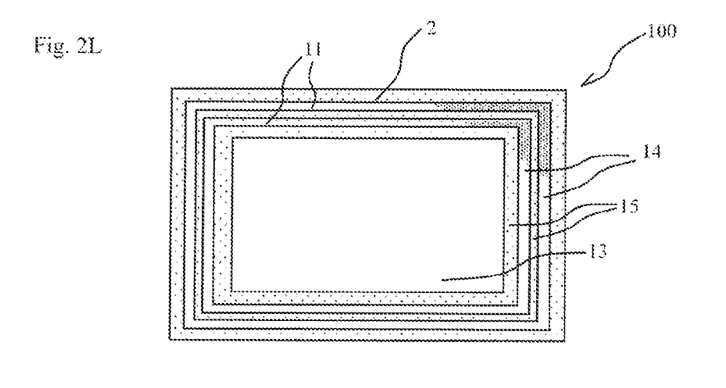

In the exemplary embodiment of FIG. 2L, in contrast to the previous exemplary embodiments, the active region 13 and the frame-like sacrificial regions 14 are not square in shape, but rectangular in shape. Overall, the semiconductor component 100 of FIG. 2L has no square, but a rectangular basic shape. But also round, oval or triangular active regions 13 or semiconductor components 100 are conceivable.

Figure 3:
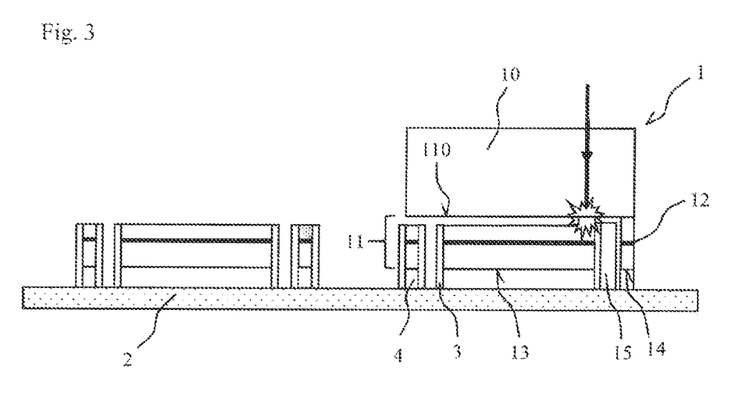
FIG. 3 a position in an exemplary embodiment of a manufacturing method described here in side view.

In the exemplary embodiment of FIG. 3, a position in a method step for producing optoelectronic semiconductor components 100 is shown that substantially corresponds to the position of FIG. 2D. Unlike in FIG. 2D, however, an encapsulation layer 3 is applied to side surfaces of the semiconductor layer sequence 11 in the entire region of the trench 15. The encapsulation layer 3 completely covers all sides of the semiconductor layer sequence 11 which are not covered by the substrate 10 or the carrier 2. In particular, the encapsulation layer 3 also completely covers a bottom region of the trench 15.

The encapsulation layer 3 may be, for example, a SiN layer which protects the semiconductor layer sequence 11 from external influences such as the entry of moisture. Upon detachment of the substrate 10 or removing of the semiconductor chips 1, any cracks within the encapsulation layer 3 are not transferred to the region of the active region 13. The active region 13 preferably remains well protected by the encapsulation layer 3. Cracks within the encapsulation layer 3 already tear off in the region of over-shaped edges on the sacrificial region 14 and do not continue on the active region 13.

Advantageously, the encapsulation layer 3 may also have an absorption layer which acts absorbent for the irradiated laser radiation. If the laser beam reaches the region of the trench 15, then without such an absorbing layer it can hit the carrier 2 unhindered and can damage it. The absorbing layer ensures that the laser beam is at least partially absorbed and does not irradiate the carrier 2 and thus does not damage it. Particularly advantageously, the encapsulation layer 3 is decomposed upon irradiation of the laser beam, so that the substrate 10 can easily be detached in the region of the trench 15.

The description made with reference to the exemplary embodiments does not restrict the invention to these embodiments. Rather, the invention encompasses any new feature and any combination of features, including in particular any combination of features in the claims, even if this feature or this combination is not itself explicitly indicated in the claims or exemplary embodiments.

The invention claimed is:

1. A method for producing an optoelectronic semiconductor component comprises:
singulating a semiconductor wafer to provide a semiconductor chip that comprises a substrate and a semiconductor layer sequence with an active layer applied to a main side of the substrate, wherein the semiconductor layer sequence has an active region for emission or absorption of radiation and a sacrificial region arranged next to the active region in a direction parallel to the main side, wherein the sacrificial region is not intended to emit or absorb radiation, and wherein a trench penetrates the active layer and separates the active region from the sacrificial region;
after singulating the semiconductor wafer, applying the semiconductor chip with the semiconductor layer sequence to a carrier;
detaching the substrate from the active region of the semiconductor layer sequence, wherein in the sacrificial region the semiconductor layer sequence remains mechanically connected to the substrate; and subsequently removing the substrate from the semiconductor layer sequence by detaching the substrate in the sacrificial region.

2. The method according to claim 1, wherein singulating the semiconductor wafer comprises providing a plurality of semiconductor chips and wherein applying the semiconductor chip to the carrier comprises simultaneously applying the plurality of semiconductor chips to the carrier, each semiconductor chip having its own, one-to-one associated substrate.

3. The method according to claim 1, wherein the substrate remains intact during the detaching and subsequent removing steps and wherein the substrate is self- supporting and mechanically stable after removing.

4. The method according to claim 1, wherein the substrate is a growth substrate of the semiconductor layer sequence.

5. The method according to claim 1, wherein, the trench completely penetrates the semiconductor layer sequence in a vertical direction, perpendicular to the lateral direction, and extends as far as the substrate.

6. The method according to claim 1, wherein the substrate is detached from the semiconductor layer sequence by a laser separation method.

7. The method according to claim 1, wherein the sacrificial region forms, in plan view of the semiconductor layer sequence, a contiguous path that runs completely around the active region of the semiconductor layer sequence.

8. The method according claim 1, wherein:
the semiconductor layer sequence has a plurality of sacrificial regions;
the sacrificial regions are separated from each other by trenches; and
the sacrificial regions, in a plan view of the semiconductor layer sequence, are arranged around the active region.

9. The method according to claim 1, further comprising, after removing the substrate from the semiconductor layer sequence, removing the semiconductor layer sequence in the sacrificial region.

10. The method according to claim 1, wherein the semiconductor chip is mechanically permanently attached and electrically contacted on the carrier while the semiconductor chip is applied to the carrier.

11. The method according to claim 1, further comprising detaching the carrier from the semiconductor chip.

12. The method according to claim 1, further comprising introducing an encapsulation layer into the trench, the encapsulation layer protecting the semiconductor layer sequence from external influences.

13. The method according to claim 1, wherein:
the substrate is a sapphire growth substrate;
the semiconductor layer sequence comprises AlInGaN and is grown on the substrate; and
the carrier is a microelectronic-containing Si-wafer.

14. An optoelectronic semiconductor component comprising:
a carrier;
a semiconductor layer sequence arranged on the carrier, the semiconductor layer sequence having an active layer extending parallel to a main side of the carrier and a sacrificial region arranged next to the active layer in a lateral direction, parallel to the main side of the carrier, the active layer configured to emit or absorb radiation during normal operation; and a trench in the semiconductor layer sequence that extends completely through the semiconductor layer sequence, the trench separating the active layer from the sacrificial region;
wherein the sacrificial region forms an edge region of the semiconductor layer sequence;
wherein the active layer or the semiconductor layer sequence is damaged in the sacrificial region;
wherein the sacrificial region is not intended to emit or absorb radiation;
wherein the semiconductor layer sequence is free of any growth substrate;
wherein no mechanically self-supporting substrate or other carrier is arranged downstream of the semiconductor layer sequence in a direction away from the carrier; and
wherein the optoelectronic semiconductor component is a single finalized optoelectronic semiconductor component.

15. The optoelectronic semiconductor component of claim 14, wherein the semiconductor layer sequence comprises AlInGaN.

16. The optoelectronic semiconductor component of claim 14, wherein the semiconductor layer sequences are identical in terms of the layer structure in the active region and in the sacrificial region; and
wherein a lateral extent of the sacrificial region in one or more directions is smaller than the lateral extent of the active region in this direction or directions.

17. An optoelectronic semiconductor component comprising:
a carrier;
a semiconductor layer sequence arranged on the carrier, the semiconductor layer sequence including an active layer extending parallel to a main side of the carrier; and
a trench in the semiconductor layer sequence which extends completely through the semiconductor layer sequence;
wherein the trench separates an active region of the semiconductor layer sequence from a plurality of sacrificial regions of the semiconductor layer sequence arranged next to the active region in a lateral direction, parallel to the main side of the carrier;
wherein the trench borders the active region and at least one sacrificial region;
wherein the semiconductor layer sequences are identical in terms of the layer structure in the active region and in the sacrificial region;
wherein a lateral extent of the sacrificial region in one or more directions is smaller than the lateral extent of the active region in this direction or directions;
wherein the sacrificial regions are arranged one behind the other;
wherein a sacrificial region forms an edge region of the semiconductor layer sequence;
wherein the optoelectronic semiconductor component is configured so that radiation is emitted or absorbed by the active layer in the active region during normal operation;
wherein in the sacrificial regions, the active layer or the semiconductor layer sequence are damaged;
wherein the sacrificial regions are not intended to emit or absorb radiation;
wherein the semiconductor layer sequence is free of any growth substrate;

wherein no mechanically self-supporting substrate or other carrier is arranged downstream of the semiconductor layer sequence in a direction away from the carrier; and wherein the optoelectronic semiconductor component is a single finalized optoelectronic semiconductor component.

18. The optoelectronic semiconductor component of claim 17, wherein the semiconductor layer sequence comprises AlInGaN.

* * * * *